United States Patent
Kouchi

(10) Patent No.: US 6,185,131 B1
(45) Date of Patent: Feb. 6, 2001

(54) NONVOLATILE SEMICONDUCTOR STORAGE DEVICE CAPABLE OF ELECTRICALLY ISOLATING DUMMY CELL ARRAY REGION FROM MEMORY CELL ARRAY REGION

(75) Inventor: Shuichiro Kouchi, Tenri (JP)

(73) Assignee: Sharp Kabushiki Kaisha, Osaka (JP)

(*) Notice: Under 35 U.S.C. 154(b), the term of this patent shall be extended for 0 days.

(21) Appl. No.: 09/578,852

(22) Filed: May 26, 2000

(30) Foreign Application Priority Data

May 27, 1999 (JP) .................................................. 11-148161

(51) Int. Cl.[7] ..................................................... G11C 16/06
(52) U.S. Cl. ..................................... 365/185.2; 365/185.16
(58) Field of Search ........................... 365/185.2, 185.16, 365/185.03, 185.24, 185.33

(56) References Cited

U.S. PATENT DOCUMENTS

| | | | |
|---|---|---|---|
| 5,615,151 | * 3/1997 | Furuno et al. | 365/185.2 |
| 5,768,184 | * 6/1998 | Hayashi et al. | 365/185.03 |
| 5,793,690 | * 8/1998 | Iwahashi | 365/210 |
| 5,870,336 | * 2/1999 | Devin | 365/185.2 |
| 5,933,366 | * 8/1999 | Yoshikawa | 365/185.03 |
| 6,031,759 | * 2/2000 | Ohashi | 365/185.2 |

OTHER PUBLICATIONS

Y. Hirano, et al. "A sensing scheme for a ACT flash memory" (Abstract) The Institute of Electronics. pp. 37–42 (May 1997).

* cited by examiner

*Primary Examiner*—Son Mai
(74) *Attorney, Agent, or Firm*—Morrison & Foerster, LLP

(57) ABSTRACT

A virtual-grounding memory cell array region and a virtual-grounding dummy cell array region are electrically isolated from each other while any increase in chip size is suppressed. An erase voltage Vers (−8 V) is applied to a dummy main bit line DMBL0 in a dummy cell array region 20 via an erase voltage supply transistor 2. A negative voltage (−8 V) is applied to drains of dummy cells DCELL0, DCELL0, ... as well as sources of dummy cells DCELL1, DCELL1, ... within a BLOCKn through dummy sub-bit lines DSBL. By electrons being injected into the floating gates of all the dummy cells DCELL in the columns of the dummy cells DCELL0 and DCELL1 within the BLOCKn, the threshold of those dummy cells DCELL becomes high. Occurrence of any charging currents and leak currents from the virtual-grounding memory cell array region to the floating capacitance of the dummy cells is prevented.

7 Claims, 6 Drawing Sheets

Program

Erase

NONVOLATILE SEMICONDUCTOR STORAGE DEVICE CAPABLE OF ELECTRICALLY ISOLATING DUMMY CELL ARRAY REGION FROM MEMORY CELL ARRAY REGION

BACKGROUND OF THE INVENTION

The present invention relates to nonvolatile semiconductor storage devices and, more particularly, to a nonvolatile semiconductor storage device of a type that a dummy cell array region is placed around a memory cell array region.

Generally, in a nonvolatile semiconductor storage device, a dummy cell array region is placed outside a memory cell array region. FIG. 2 is a schematic view of a common semiconductor storage device. A dummy cell array region 200 is placed so as to surround a memory cell array region 100.

It has become essential to place dummy cells (not shown) in the dummy cell array region 200 in order to uniformize the characteristics of the nonvolatile semiconductor storage device. This is due to the following reason. That is, whereas the configuration of the gate electrode that strongly affects the performance of memory cells (not shown) of the memory cell array region 100 is determined by exposure conditions and etching conditions, these conditions are strongly affected by peripheral patterns. If the dummy cell array region 200 is not provided, the gate electrodes of memory cells are indeed regularly arranged inside the memory cell array region 100 but this regularity would collapse in the outer periphery. On this account, there would arise differences in the configuration of gate electrodes in the outer periphery of the memory cell array region 100, which would cause variations in memory cell characteristics.

Thus, to avoid this, the dummy cell array region 200 is placed outside and around the memory cell array region 100 as shown in FIG. 2 so that a regular arrangement pattern of gate electrodes is given also in the outer periphery of the memory cell array region 100.

Therefore, dummy cells in the dummy cell array region 200 are formed so as to have a device configuration as well as a layout configuration closest possible to those of the original memory cells, while the dummy cells do not function as memory cells and are required to be electrically isolated from the memory cells so as not to affect the operation of the original memory cells.

FIG. 3 shows a circuit diagram of the memory cell array region 100 and the dummy cell array region 200 of a known ETOX (EPROM Thin Oxide) type nonvolatile semiconductor storage device. In the memory cell array region 100, each memory cell (field-effect transistor) MCELL has drain and source. In the memory cell MCELL, the drain is formed independently, and this drain is connected to a main bit line MBL while the source is connected to Vss (GND level). By desired word lines WL being selected, desired memory cells MCELL are selected, and currents flowing through the memory cells MCELL via main bit lines MBL0, MBL1, ... are sensed, by which data is read. Meanwhile, in the dummy cells DCELL, although memory cells are formed as in the regular memory cells MCELL, the drain is floating, with current paths not present, having no effects on the memory cell array region 100. Thus, the dummy cell array region 200 is electrically isolated from the regular memory cell array region 100.

However, in recent years, there has been a demand for larger capacity and lower power consumption of flash memories, and attention is focused on flash memories of the virtual-grounding array configuration capable of high integration suitable for that demand.

This is exemplified by an ACT (Asymmetrical contactless transistor) flash memory announced in "A sensing scheme for an ACT flash memory," Proceedings of The Institute of Electronics, Information and Communication Engineers, ICD 97-21, p. 37, 1997.

This ACT flash memory employs FN (Fowler-Nordheim) tunneling phenomenon for programming and erasure, thus capable of lowering the power consumption.

The ACT flash memory is explained with reference to FIGS. 4 and 5A, 5B.

The ACT flash memory employs the FN tunneling phenomenon for programming and erasure as described above, and has a virtual-grounding array configuration in which one main bit line MBL is shared by two rows of memory cells MCELL.

As schematically shown in FIG. 4, one main bit line MBL is shared by both side memory cells MCELL, and a diffusion layer is used for sub-bit lines SBL so that the number of contacts 9 is reduced, making the array area significantly decreased. Thus, a higher integration is enabled.

Referring to FIG. 4, MBL0–MBLn+1 denote main bit lines, SBL0–SBLn+1 denote sub-bit lines formed by the diffusion layer, WL0–WL63 denote word lines, SG0 denotes a gate line for select transistors 4 for selecting this block, numeral 9 denotes contacts between the main bit lines MBL and the sub-bit lines SBL (different in hierarchy from the main bit lines MBL).

Next, a cross section of the ACT flash memory device is shown in FIGS. 5A and 5B.

This ACT flash memory device has, on a substrate 11, sub-bit lines SBL (diffusion layer), tunneling oxide 12, floating gates FG, an interlayer insulator 13 and control gates WL (continuing to word lines WL and shown by the same reference character as the word lines WL) in a layered structure. Then, the common sub-bit line SBL provided under end portions of the neighboring floating gates FG is differentiated in donor concentration between drain and source sides.

Next, programming and erasure onto the ACT flash memory by using the FN tunneling phenomenon are explained.

First, a programming operation is carried out, as shown in FIG. 5A, by applying a negative voltage (−8 V) to the control gate WL of a desired memory cell MCELLm, applying a positive voltage (+5 V) to the drain side via the sub-bit line SBL, and bringing the source side into a floating state.

As a result, an FN tunneling phenomenon occurs to the drain side of the memory cell MCELLm, by which electrons are pulled out from the floating gate FG to the drain side. Then the threshold of the memory cell MCELLm lowers to about +1.5 V, thus resulting in a programmed state.

An erasing operation, on the other hand, is carried out, as shown in FIG. 5B, by applying a positive voltage (+10 V) to the control gate WL of a desired memory cell MCELLm, and applying a negative voltage (−8 V) to the substrate (p-type well) 11 and further by applying a negative voltage (−8 V) to the source and drain sides via the sub-bit line SBL. As a result, a FN tunneling phenomenon occurs to between a channel layer 14 and the floating gate FG, by which electrons are injected into the floating gate FG. Then the threshold of the memory cell MCELLm rises to about +4 V or more, thus resulting in an erased state.

A flash memory using the FN tunneling phenomenon for both programming and erasing operations as shown above is called FN-FN operational flash memory.

Also, a reading operation is carried out by applying +3 V to the control gate WL of a desired memory cell MCELL, applying +1 V to the drain and applying 0 V to the source via the sub-bit lines SBL. Then the current flowing through the memory cell MCELL is sensed by an unshown sensing circuit, by which data is read out.

Applied voltages to the memory cell MCELL involved in the above operations are listed in the following Table 1:

TABLE 1

Applied voltages of ACT flash memory:

|  | Control gate | Drain | Source | P-type well |
|---|---|---|---|---|
| Program | −8 V | 5 V | Open | 0 V |
| Erase | 10 V | −8 V | −8 V | −8 V |
| Read | 3 V | 1 V | 0 V | 0 V |

The virtual-grounding array configuration including dummy cells of the ACT flash memory is shown in FIG. 6.

Referring to FIG. 6, a portion surrounded by one-dot chain line is a dummy cell array region 400, and the dummy cell array in this dummy cell array region 400 is made into the same configuration as the original memory cell arrays in a memory cell array region 300 as described above. However, this dummy cell array, unlike the regular memory cell array, has no function of setting the threshold high by injecting electrons into the floating gate of a dummy cell DCELL.

A reading operation with occurrence of problems in this configuration is explained with reference to FIG. 6.

For example, let us consider a case where a memory cell MCELL2 is read. First, for selection of a block "n" (hereinafter, referred to as BLOCKn), gate SGn of a select transistor 4 is turned ON (+3 V is applied to gate SGn), and then +3 V is applied to a desired word line WL (WL0N in this example) out of the word lines WL0n–WL31n. Meanwhile, 0 V is applied to word lines (WL1n–WL31n in this example) to which the gates of the non-select memory cells are connected, while 0 V is applied also to the substrate (p-type well).

Then, +1 V is applied to a main bit lines MBL2, which is connected to the drain of the memory cell MCELL2, and 0 V is applied to a main bit lines MBL3 connected to the source.

As a result of this, if the memory cell MCELL2 is in the programmed state (with threshold low), a current flows from the main bit line MBL2 via its sub-bit line SBL and memory cell MCELL2 to the main bit line MBL3. On the other hand, if the memory cell MCELL2 is in the erased state (with threshold high), no current flows from the main bit line MBL2 and its sub-bit line SBL via the memory cell MCELL2 to the main bit line MBL3.

This current is sensed by a sensing circuit connected to main bit line MBL2, which is not shown, and whether the memory cell MCELL2 is in the programmed state or the erased state is read as data ("1" or "0").

However, in the virtual-grounding array configuration, since a main bit line MBL (sub-bit line SBL) is shared by two neighboring memory cells MCELL as described before, reading of data from a memory cell MCELL is affected by the state of its neighboring memory cell MCELL.

For example, when reading a memory cell MCELL in the erased (high threshold) state, if its neighboring memory cells MCELL0 and MCELL1 are programmed (low-threshold) state, a current would flow to the main bit line MBL0 (with 0 V applied) via the memory cells MCELL0 and MCELL1 from the main bit line MBL2 (with 1 V applied) through its sub-bit line SBL.

In principle, a current would not flow in the reading of the memory cell MCELL2. However, because of this sneak current, the sensing circuit connected to the main bit line MBL2 may sense a current, which would bring about a programmed state and a misreading of the memory cell MCELL2.

To avoid this, a 1 V is applied also to a neighboring main bit line (MBL1 in this example) so that unnecessary sneak current does not occur regardless of the state of the memory cell MCELL1 or MCELL0. Thus, a desired level of the main bit line MBL2 is established.

Because of the virtual-grounding array configuration, the same thing would occur also to the dummy cell array region 400. That is, there has been a possibility that in the case of selecting and reading a memory cell MCELL located in outer peripheral portion, the dummy cells DCELL, which are originally intended to eliminate any variations in characteristics of the memory cells MCELL which are located in the outer periphery of the memory cell array region 300, causes a lowering reading margin and besides a misreading of the memory cell MCELL located in the outer peripheral portion due to an effect of a neighboring dummy cell DCELL (in this case, charging current or leak current to floating capacity of dummy cell DCELL) as described above. In addition, there has been no function of setting high the threshold of the dummy cells DCELL of the dummy cell array region 400.

SUMMARY OF THE INVENTION

Therefore, in view of these and other problems of the nonvolatile semiconductor storage device having a virtual-grounding array configuration, an object of the present invention is to provide a nonvolatile semiconductor storage device which is enabled to electrically isolate the dummy cell array region from the memory cell array region while increase in the chip size is reduced to the utmost.

In order to achieve the above object, the present invention provides a nonvolatile semiconductor storage device comprising:

a virtual-grounding memory cell array region in which memory cells are arrayed in rows and columns, each of the memory cells comprising a floating-gate field-effect transistor having control gate, floating gate, drain and source and capable of electrically programming and erasing information, the virtual-grounding memory cell array region further containing a plurality of row lines to which the control gates of memory cells constituting individual rows are connected, respectively, as well as a plurality of column lines to which the drains of memory cells constituting individual columns and the sources of memory cells constituting individual columns other than said individual columns are connected, respectively; and a virtual-grounding dummy cell array region in which dummy cells are arrayed in rows and columns, each of the memory cells comprising a floating-gate field-effect transistor having control gate, floating gate, drain and source, the virtual-grounding dummy cell array region further containing the plurality of row lines to which the control gates of dummy cells constituting individual rows are connected, respectively, as well as a plurality of column lines to which the drains of memory cells constituting individual columns and the sources of memory cells constituting individual columns other than said individual columns are connected, respectively, the virtual-grounding dummy cell array region being placed in outer periphery of the virtual-grounding memory cell array region, wherein the nonvolatile semiconductor storage device has a function of injecting electrons into the floating gates of at least dummy cells located in a neighborhood of the virtual-grounding memory cell array region.

According to this invention, since the virtual-grounding dummy cell array region is generally of the same pattern as the virtual-grounding memory cell array region, collapses in the regularity of the electrode pattern in the outer periphery of the virtual-grounding memory cell array region can be prevented, by which variations in the characteristics of memory cells can be suppressed. Moreover, when electrons are injected into the floating gates of dummy cells located in the neighborhood of the virtual-grounding memory cell array region so that the threshold of the dummy cells is set high, the virtual-grounding memory cell array region and the virtual-grounding dummy cell array region are electrically isolated from each other. Therefore, occurrence of any charging currents and leak currents from the virtual-grounding memory cell array region to the floating capacitance of the dummy cells can be prevented, and misreads and margin reduction of memory cells located in the outer periphery of the virtual-grounding memory cell array region can be prevented.

The function and effects of this invention that misreads and margin reduction of memory cells can be prevented is particularly effective for cases where the memory cells are provided in high integrations or where memory cells are scaled down.

One embodiment comprises dummy cell threshold setting means capable of injecting electrons into the floating gates of at least dummy cells neighboring the virtual-grounding memory cell array region out of the dummy cells in the virtual-grounding dummy cell array region, thereby setting threshold of the dummy cells to a high value.

According to this embodiment, the dummy cell threshold setting means injects electrons into at least dummy cells neighboring the virtual-grounding memory cell array region out of the dummy cells in the virtual-grounding dummy cell array region, thereby setting threshold of the dummy cells to a high value. Therefore, the virtual-grounding memory cell array region and the virtual-grounding dummy cell array region are electrically isolated from each other, by which occurrence of any charging currents and leak currents from the virtual-grounding memory cell array region to the floating capacitance of the dummy cells can be prevented, and misreads and margin reduction of memory cells located in the outer periphery of the virtual-grounding memory cell array region can be prevented.

In one embodiment, each of the memory cells is enabled to have three or more thresholds corresponding to three- or higher-valued storage states, and the dummy cell threshold setting means sets the threshold of the dummy cells to the highest threshold out of the three or more thresholds.

In the case where three- or more values are stored in the memory cells of the virtual-grounding memory cell array region, the storage would be more liable to be affected by the virtual-grounding dummy cell array region because of less margin. However, according to this embodiment, the dummy cell threshold setting means sets the threshold of the dummy cells to the highest value out of the three or more thresholds. Therefore, the virtual-grounding memory cell array region and the virtual-grounding dummy cell array region are electrically isolated from each other, by which occurrence of any charging currents and leak currents from the virtual-grounding memory cell array region to the floating capacitance of the dummy cells can be prevented. Further, even in a nonvolatile semiconductor storage device designed to store multi-level values, misreads and margin reduction of memory cells located in the outer periphery of the virtual-grounding memory cell array region can be prevented with reliability.

In one embodiment, the dummy cell threshold setting means is a negative-voltage supply transistor connected to the column lines of the dummy cells in the virtual-grounding dummy cell array region and capable of applying a negative voltage thereto.

According to this embodiment, since the dummy cell threshold setting means is a negative-voltage supply transistor connected to the column lines of the dummy cells in the virtual-grounding dummy cell array region and capable of applying a negative voltage thereto, the dummy cell threshold setting means can be implemented by a simple circuit while increase in the chip size can be suppressed to the utmost. In particular, when the negative-voltage supply transistor is connected a negative voltage source for supplying a negative voltage to the memory cells in the virtual-grounding memory cell array region, the need for providing additional power supply or the like for use of dummy cells is eliminated, so that the circuit is never complicated.

In one embodiment, the virtual-grounding dummy cell array region has a device configuration, an interconnect layer configuration and interconnections similar to those of the virtual-grounding memory cell array region.

According to this embodiment, the virtual-grounding dummy cell array region has a device configuration, an interconnect layer configuration and interconnections similar to those of the virtual-grounding memory cell array region, thus simple to fabricate. Besides, collapses in arrangement pattern of the gate electrodes and the like in the peripheral portions of the virtual-grounding memory cell array region can be prevented, by which variations in the characteristics of memory cells can be suppressed.

In one embodiment, the setting of the highest threshold to the memory cells in the virtual-grounding memory cell array region is performed in blocks or collectively, and, at the same time, the setting of the highest threshold to the dummy cells is performed.

According to this embodiment, the setting of the highest threshold to the memory cells in the virtual-grounding memory cell array region is performed by the block or collectively, and, at the same time, the setting of the highest threshold to the dummy cells is performed. Therefore, the setting of the threshold to the dummy cells does not cause any additional increase in the setting time.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

Figure 1:
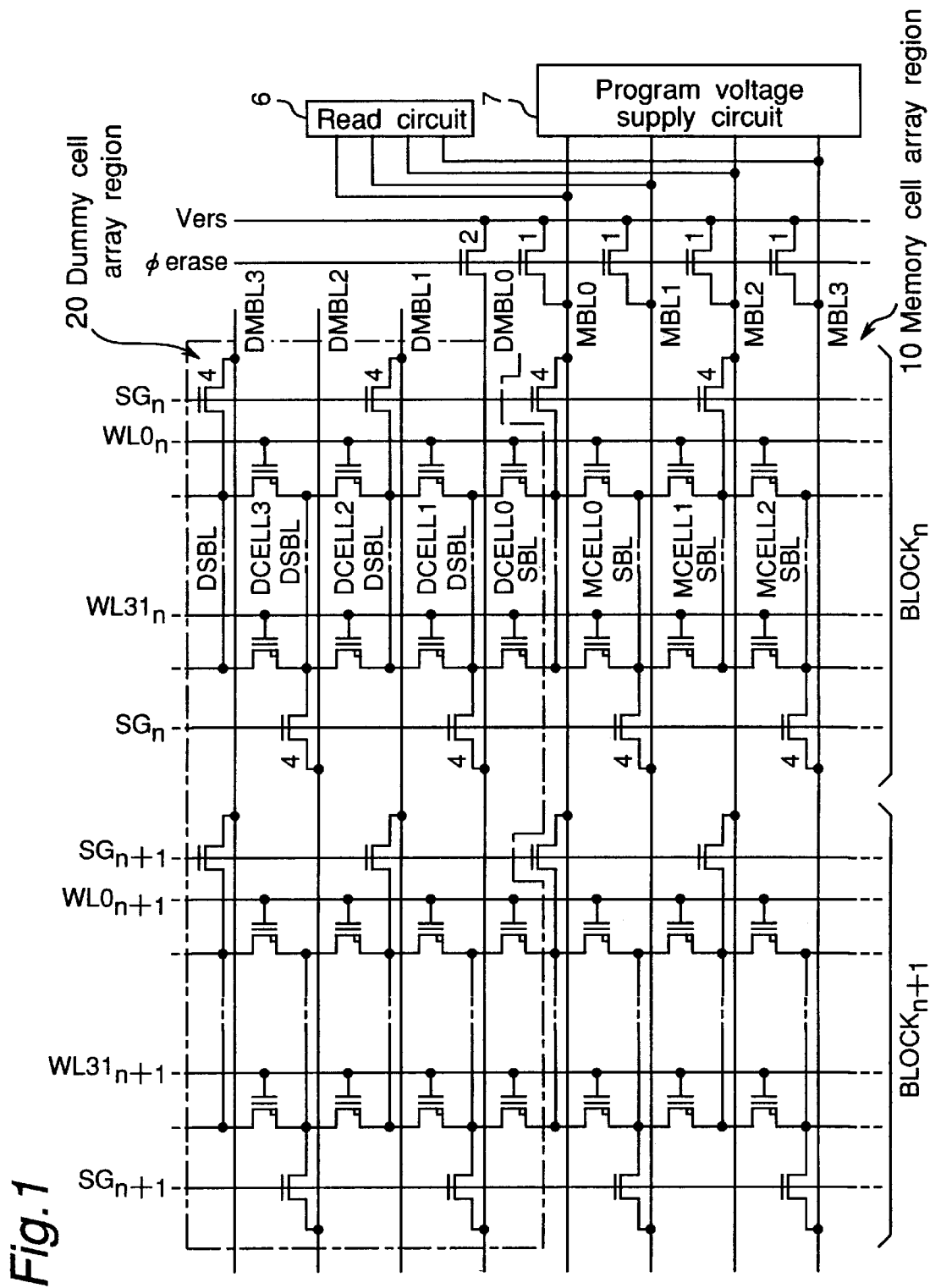
FIG. 1 is a view showing an array configuration of an ACT flash memory according to an embodiment of the invention.
Figure 2:
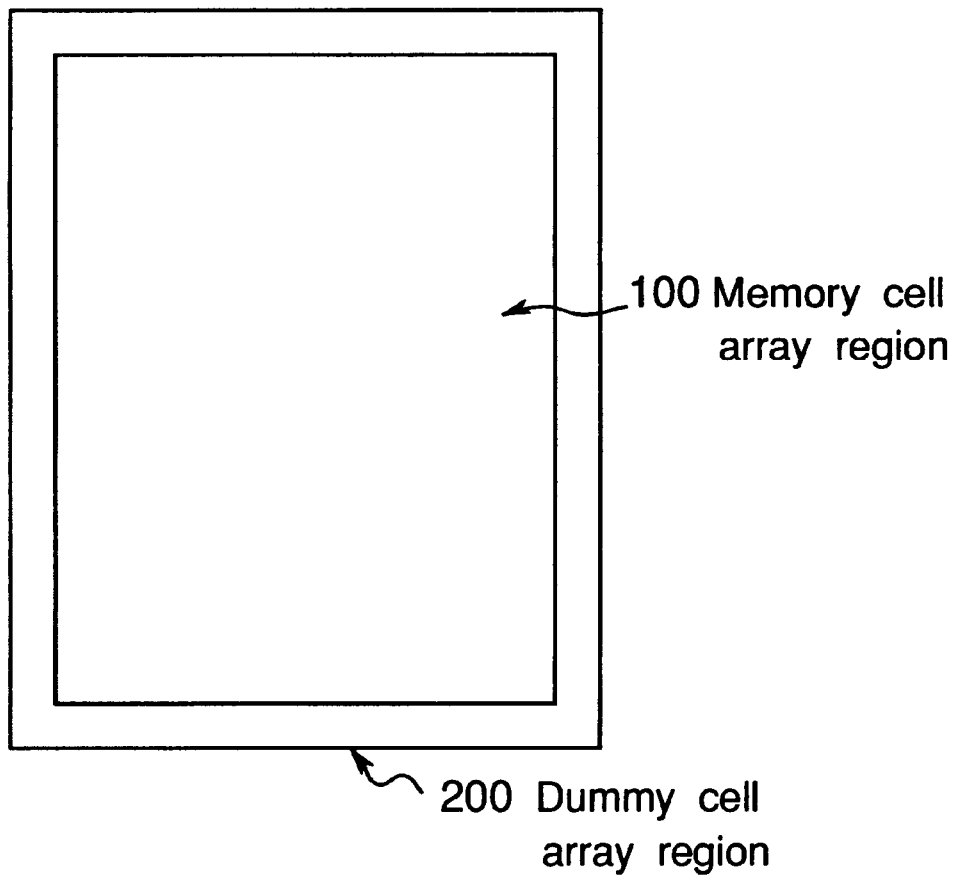
FIG. 2 is a schematic view of a chip in the semiconductor storage device.
Figure 3:
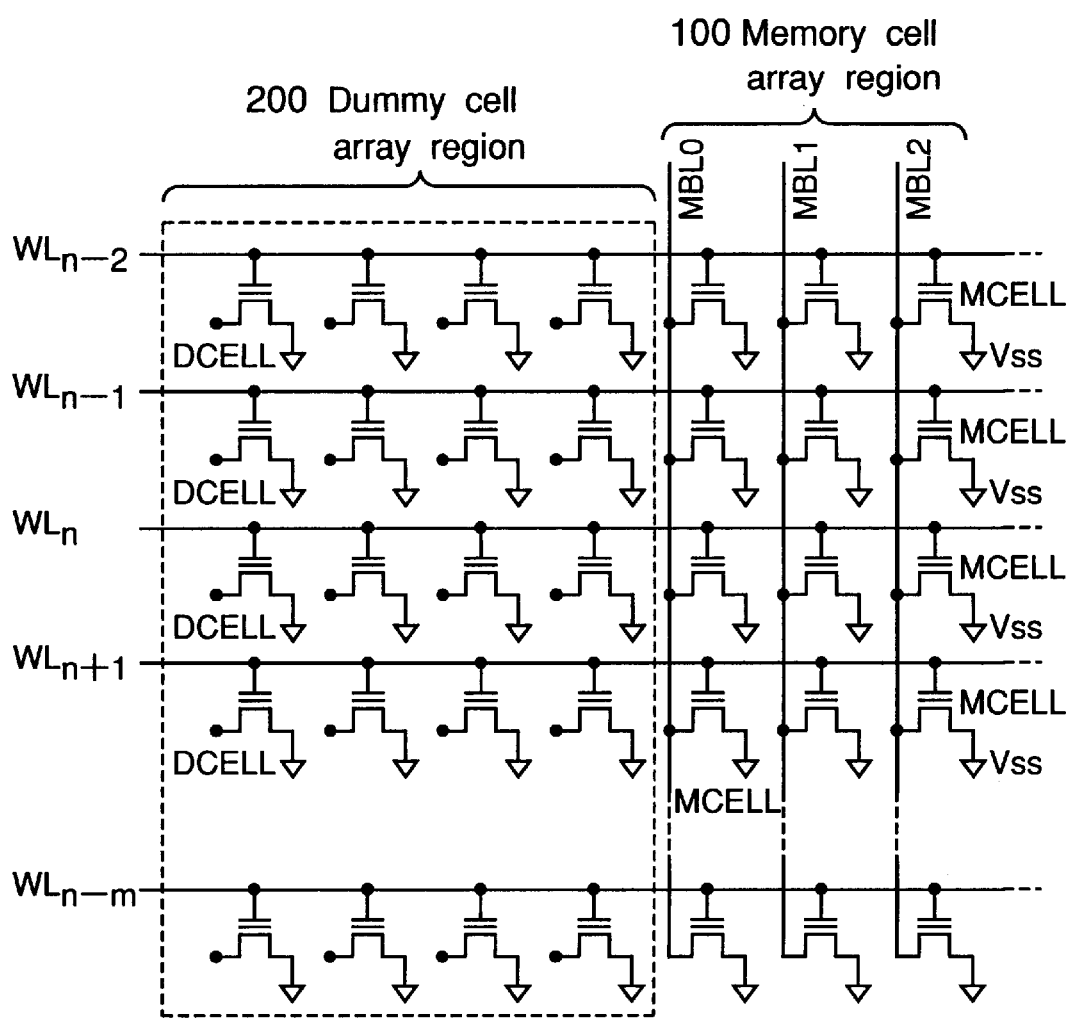
FIG. 3 is a circuit diagram of memory cell array region and dummy cell array region of part in a common ETOX nonvolatile semiconductor storage device.
Figure 4:
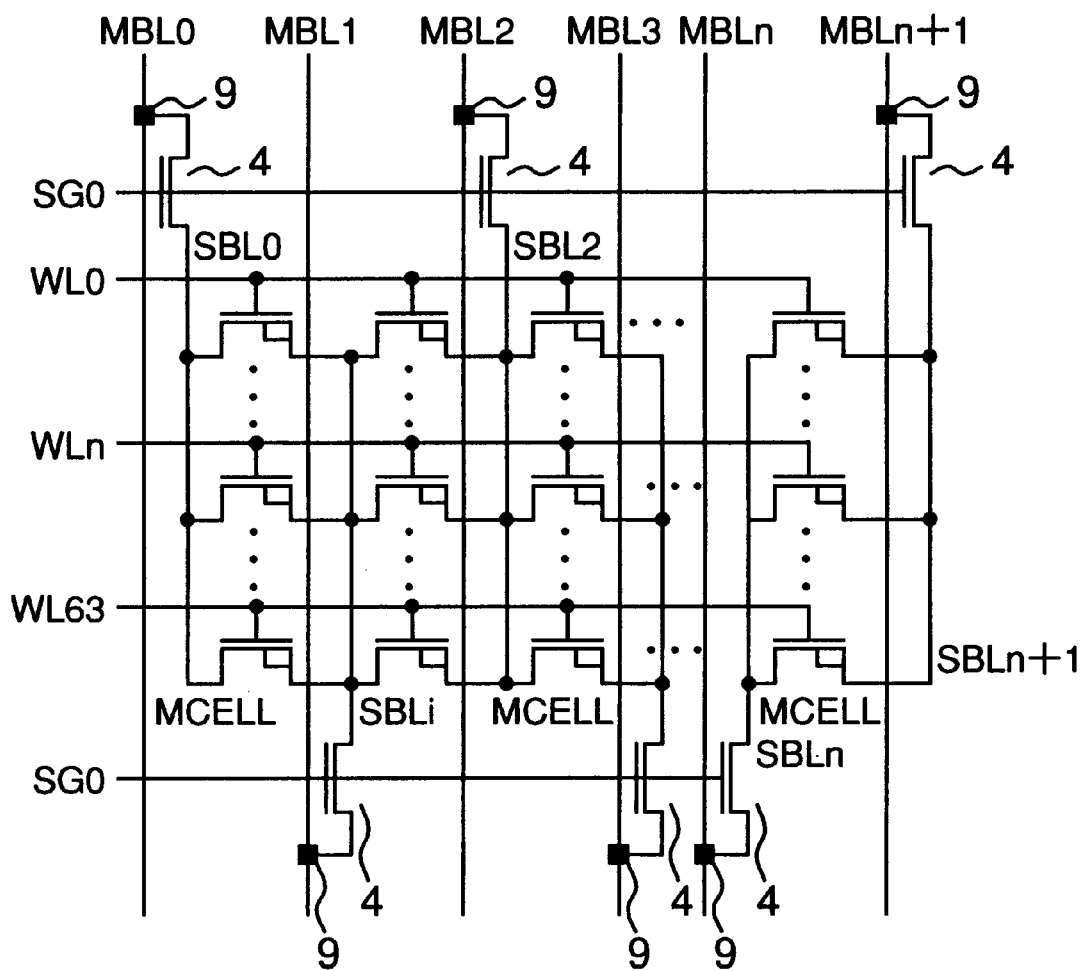
FIG. 4 is a view showing an array configuration of an ACT flash memory according to the prior art.
Figure 5A:
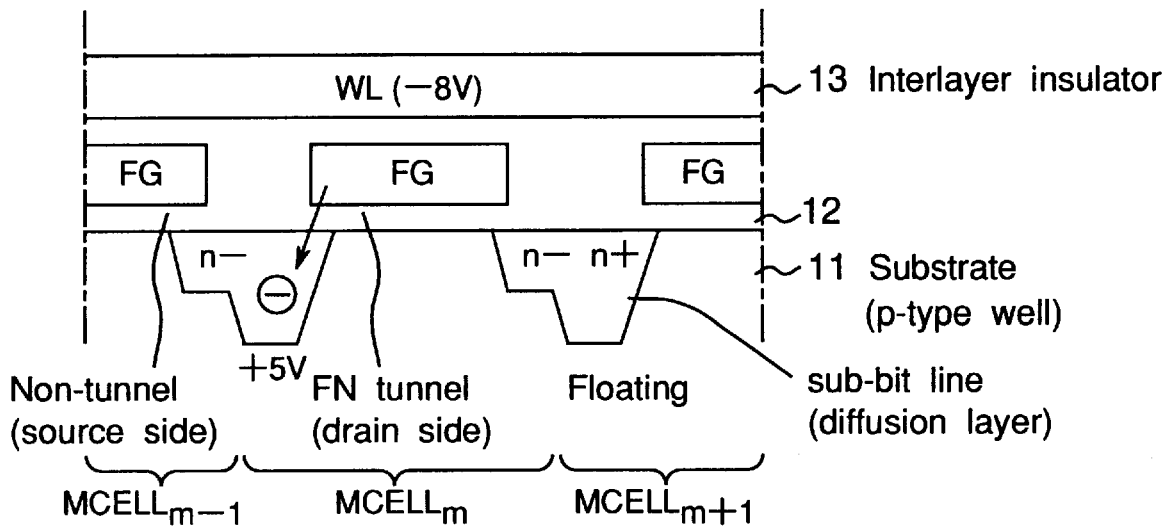
FIGS. 5A and 5B are sectional views of a memory cell of the ACT flash memory.
Figure 5B:
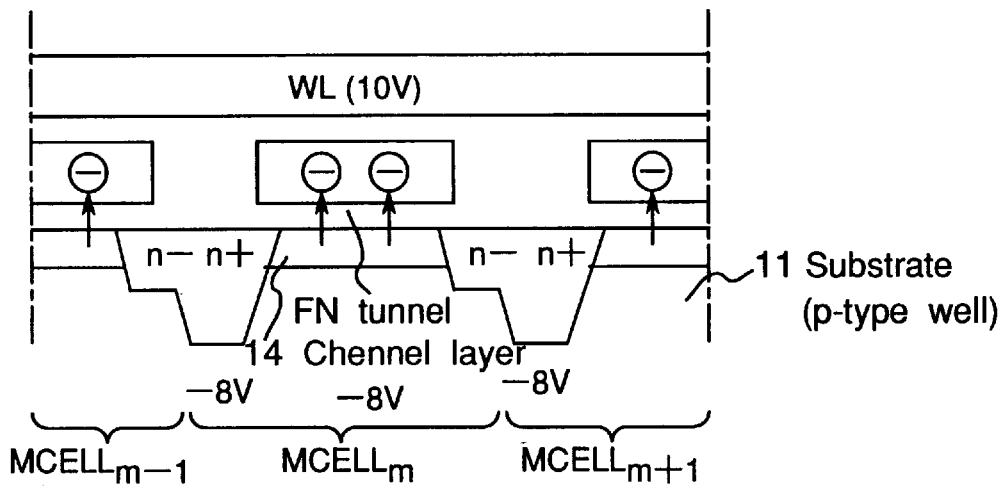
Figure 6:
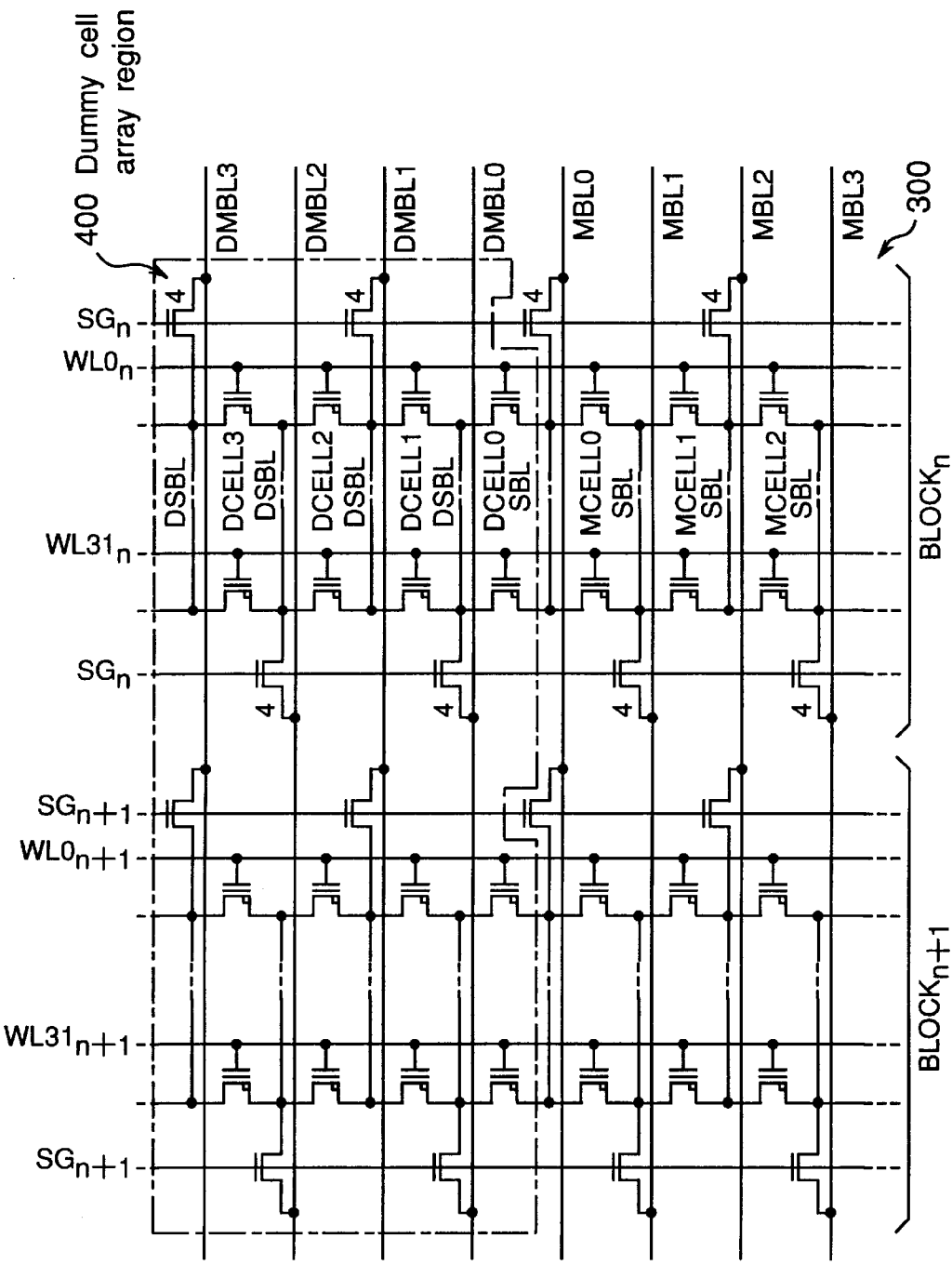
FIG. 6 is a view showing an array configuration of a virtual-grounding ACT flash memory including a dummy cell array region according to the prior art.

As shown in FIG. 1, a dummy cell array region (a portion surrounded by one-dot chain line) 20 is placed in outer periphery of a memory cell array region 10 having a virtual-grounding array configuration, where the dummy cell array region 20 has device configuration, interconnecting layer configuration and interconnections generally similar to those of the regular memory cell array region 10.

An erase voltage Vers (−8 V in this case) is applied to each of main bit lines MBL0, MBL1, MBL2 . . . as columns via erase voltage supply transistors 1, 1, 1 . . . connected to a supply line for the erase voltage.

Similarly connected to the supply line for the erase voltage Vers (−8 V) via an erase voltage supply transistor 2 serving as a negative voltage supply transistor, is a dummy main bit line DMBL0 as a column connected via a dummy sub-bit line DSBL to the drain of the dummy cell DCELL0, DCELL0, . . . nearest to the regular memory cells MCELL out of the dummy cell array region 20.

The erase voltage supply transistor 2 is not connected to the other dummy main bit lines DMBL1, DMBL2, DMBL3, . . . , which are opened.

To each of the main bit lines MBL0, MBL1, MBL2, are connected a program voltage supply circuit 7 for supplying a positive voltage (+5 V) to the drain of the memory cell MCELL at the time of writing, and a read circuit 6 for applying the above described +1 V or 0 V to the memory cell MCELL and sensing a current flowing therethrough at the time of reading.

First, an erasing operation for electrically isolating the dummy cell array region 20 from the memory cell array region 10 is described.

The following description is directed to a case of erasing the BLOCKn by way of example.

With the select transistor 4 turned ON (+10 V applied to gate SGn), a Vpp (10 V, see control gate of Table 1) is applied to word lines WL0n–WL31n as rows of the BLOCKn selected by the turn-ON of the select transistor 4, and a negative voltage (−8 V, see Table 1) is applied to the substrate (p-type well).

Meanwhile, a negative voltage Vers (−8 V, see drain and source in Table 1) is applied to the main bit lines MBL1–MBL4095 (not shown) of the memory cell array region 10 via their respective erase voltage supply transistors 1 (in ON state with 0 V applied to φerase). A negative voltage (−8 V) is applied to the drains and sources of all the memory cells MCELL in the BLOCKn through their respective sub-bit lines SBL.

As a result of this, electrons are injected into the floating gates of all the memory cells MCELL of the memory cell array region 10 within the BLOCKn by the FN tunneling phenomenon, so that all the memory cells MCELL become high in threshold, resulting in an erased state.

At the same time, the same voltage is applied to the gates SGn of the select transistors 4 in the dummy cell array region 20 and the word lines WL03–WL31n as rows, because these are in common to those of the memory cell array region 10.

Accordingly, Vpp is applied also to the control gates of the dummy cells DCELL in the dummy cell array region 20, and a negative voltage (−8 V) is applied to the substrate (p-type well), which is in common to the memory cell array region 10.

Meanwhile, the erase voltage Vers (−8 V) is applied also to the dummy main bit line DMBL0 of the dummy cell array region 20 via an erase voltage supply transistor 2 (also in ON state with 0 V applied to φerase) serving as a negative voltage supply transistor. A negative voltage (−8 V) is applied to the drains of the dummy cells DCELL0, DCELL0, . . . and the sources of the dummy cells DCELL1, DCELL1, . . . in the BLOCKn through the dummy sub-bit lines DSBL.

As a result of this, electrons are injected into the floating gates of all the dummy cells DCELL of at least columns of the dummy cells DCELL0 and DCELL1 within the BLOCKn, so that the dummy cells DCELL become high in threshold, resulting in an erased state.

In addition, although the erase operation by the block has been explained above, yet the erase may also be done collectively for all the blocks.

Next, a programming operation is described.

Here is assumed that a memory cell MCELL0 of the BLOCKn is programmed. In this case, the erase voltage supply transistors 1 and 2 are kept OFF. By applying a positive voltage (+10 V) to the gates SGn of the select transistors 4 of the BLOCKn, the select transistors 4 are turned ON.

A negative voltage (−8 V, see control gate in Table 1) is applied to the word line WL0n connected to the memory cell MCELL0 to be programmed out of the BLOCKn, while Vss (0 V) is applied to the non-select word lines WL1n–WL31n. Also, 0 V is applied to the substrate (p-type well). A positive voltage (+5 V, see drain of Table 1) is applied to the main bit line MBL0 from the program voltage supply circuit 7.

In this process, the main bit line MBL1 connected to the source of the memory cell MCELL0 is put into floating state by the program voltage supply circuit 7.

As a result of this, the memory cell MCELL0 releases out electrons from its floating gate by the FN tunneling phenomenon, going low in threshold, resulting in a programmed state.

For this operation, the negative voltage (−8 V) is applied to the control gate of the dummy cell DCELL0 neighboring the memory cell MCELL0, because the word line WL0n to which the control gate of the dummy cell DCELL0 is connected is in common to the memory cell array region 10, as in the case of the memory cell array region 10. However, the drain of the dummy cell DCELL0 is kept floating, and does not result in a programmed state.

The programming operation is carried out by sequentially selecting the select transistors 4, the main bit lines MBL and the word lines WL as shown above. Thus, all the memory cells MCELL are programmed.

Finally, a reading operation is described on a case where the memory cell MCELL0 is read.

Firstly, with a positive voltage (+3 V) applied to the gates SGn of the select transistors 4, 4, 4 . . . , these select transistors 4, 4, 4 . . . are turned ON. A positive voltage (+3 V, see control gate in Table 1) is applied to a desired word line WL0n in the BLOCKn. Meanwhile, a Vss (0 V) is applied to the word lines WL1n–WL31n to which the control gates of the non-select memory cells MCELL are connected, and 0 V is applied also to the substrate (p-type well).

For reading the memory cell MCELL0, +1 V is applied to the main bit line MBL0, and 0 V is applied to the main bit line MBL1 by the read circuit 6. These voltages are applied to the memory cell MCELL0 via the select transistor 4 and the sub-bit line SBL.

Then, in the read circuit 6, a current flowing through the main bit line MBL0 is sensed. If the memory cell MCELL0 is in the programmed state (with threshold low), a current flows; if the memory cell MCELL0 is in the erased state (with threshold high), conversely, a current does not flow.

During the reading operation in the memory cell array region 10, the neighboring dummy cell DCELL0 keeps erased state (a state of high threshold) as described above.

Because of the high threshold of the dummy cell DCELL0, sneak leak currents to the dummy cells DCELL0, DCELL1, DCELL2, . . . (in this case, charging current to floating capacitance of dummy cells DCELL0, DCELL1, DCELL2, . . . ) by which the word line WL0n is shared do not occur from the main bit line MBL0 (with +1 V applied). Thus, the reading of the memory cell MCELL0 is correctly achieved.

Reading is carried out on all the memory cells MCELL by sequentially selecting the select transistors 4, the main bit lines MBL and the word lines WL in the same way as described above.

It is noted that the description hereinabove is based on the assumption that the state in which the threshold of a memory cell MCELL is high is an erased state while the state in which the threshold of a memory cell MCELL is low is a programmed state, for convenience sake. However, this is a matter of definition, and there are some cases where in the first place, a state in which electrons are pulled out from the floating gate in blocks or collectively is taken as an erased state and then a state in which electrons are injected into the floating gate is taken as a programmed state.

Accordingly, it is the gist of the invention that the threshold value of a dummy cell DCELL is brought into a first value (a value of high threshold obtained by injecting electrons into the floating gate) in a bi-level ("1," "0") nonvolatile semiconductor storage device.

The above embodiment has been described on a bi-level ACT flash memory. However, the invention is not limited to the above-described embodiment.

In recent years, multi-level techniques by the virtual-grounding array configuration have been proposed with a view to further capacity enhancement toward larger memory capacities. The present invention exhibits more effects on the implementation of this bi-level techniques.

For example, in a four-level ("11," "10," "01," "00") ACT flash memory of the virtual-grounding array configuration, the memory cell array region and the dummy cell array region are similar to those of FIG. 1 in the foregoing case. FIG. 1 is used as an aid for the following description. Thresholds of four-level memory cells MCELL are set to a first value of 4 V or thereabout, a second value of 2.8 V or thereabout, a third value of 1.8 V or thereabout, and a fourth value of 0.8 V or thereabout.

Erasing operation (with a setting to the first value, the highest threshold) is the same as in the foregoing method.

Next, writing operation is the same as in the foregoing method. However, although the description is omitted in the foregoing case, in the writing operation to the memory cell MCELL, while it is verified whether or not a specified threshold voltage has been reached, a write voltage is applied in a pulsed form so that the write time is changed, by which the injection amount of electrons to the floating gate is controlled and thereby the memory cell MCELL is set to a specified threshold.

For reading operation, on the other hand, for example, 1.3 V, 2.3 V and 3.3 V are applied sequentially to the word line WL connected to the control gate of the memory cell MCELL to be read, and then the presence or absence of a current is detected by the read circuit 6 connected to the main bit line MBL to which the voltage is applied as in the foregoing case, by which the threshold of the memory cell MCELL is determined.

In this case also, by setting the threshold of the dummy cell DCELL0 to the first value (4 V) as in the foregoing case, effects of the sneak leak current to the dummy cell array region 20 can be avoided.

With the read margin decreased as a result of the multi-level technique, it would be impermissible to neglect errors in sensed voltage due to voltage drops attributable to large resistance of the sub-bit lines SBL formed in the diffusion layer which has produced less effects before, or due to voltage increases conversely.

Because of this, heretofore, there would arise significant effects of voltage drops and voltage increases of the sub-bit lines in the outer peripheral portion of the memory cell array region due to the flow of a sneak leak current to the dummy cell array region, resulting in even larger adverse effects on the sense for reading.

Accordingly, in the multi-level, virtual-grounding flash memory, as in this embodiment, it is essential to electrically isolate the dummy cell array region 20 and the memory cell array region 10 from each other by setting the threshold of the dummy cell DCELL to the highest first value.

Although the dummy cell array region 20 is provided in three columns of dummy cells DCELL0–DCELL3 in the above embodiment, the number of columns may be any one within such a range that the gate electrodes of the memory cells MCELL in the outer periphery of the memory cell array region 10 can be fabricated into uniform configuration, and that variations in the characteristics of the memory cells MCELL can be suppressed.

Although the erase voltage supply transistor 2 is connected only to the dummy main bit line DMBL0 connected to the drain of the dummy cell DCELL0 located near the outer periphery of the memory cell array region 10 in the above embodiment, yet another erase voltage supply transistor 2 may also be connected to the dummy main bit line DMBL1 connected to the drain of the dummy cell DCELL1. Moreover, erase voltage supply transistors may be connected also to the dummy main bit lines DMBL2, DMBL3, . . . , so that the dummy cell array region is made closer to the same pattern as the memory cell array region.

Whereas the invention has been described in detail, the invention is not limited to the ACT flash memory but effective for all nonvolatile semiconductor storage devices having the virtual-grounding array configuration.

As apparent from the above description, according to the present invention, since the virtual-grounding dummy cell array region is generally of the same pattern as the virtual-grounding memory cell array region, collapses in the regularity of the electrode pattern in the outer periphery of the virtual-grounding memory cell array region can be prevented, by which variations in the characteristics of memory cells can be suppressed. Moreover, since the device has a function of injecting electrons into the floating gates of at least dummy cells located in the neighborhood of the virtual-grounding memory cell array region out of the dummy cells of the virtual-grounding dummy cell array region, the virtual-grounding memory cell array region and the virtual-grounding dummy cell array region can be electrically isolated from each other by injecting electrons into the floating gates of those dummy cells so that their threshold is set high. Therefore, occurrence of any charging currents and leak currents from the virtual-grounding memory cell array region to the floating capacitance of the dummy cells can be prevented, and misreads and margin reduction of memory cells located in the outer periphery of the virtual-grounding memory cell array region can be prevented.

Also, according to one embodiment, by injecting electrons into the floating gates of at least dummy cells neighboring the virtual-grounding memory cell array region out of the dummy cells in the virtual-grounding dummy cell array region by means of the dummy cell threshold setting means, the threshold of those dummy cells can be set to the high value. Thus, the virtual-grounding memory cell array region and the virtual-grounding dummy cell array region can be electrically isolated from each other, by which occurrence of any charging currents and leak currents from the virtual-grounding memory cell array region to the floating capacitance of the dummy cells can be prevented, and misreads and margin reduction of memory cells located in the outer periphery of the virtual-grounding memory cell array region can be prevented.

Further, according to one embodiment, since the dummy cell threshold setting means sets the threshold of dummy cells to the highest value out of three or more thresholds, the virtual-grounding memory cell array region and the virtual-grounding dummy cell array region can be electrically isolated from each other, by which occurrence of any charging currents and leak currents from the virtual-grounding memory cell array region to the floating capacitance of the dummy cells can be prevented. Further, even in a nonvolatile semiconductor storage device designed to store multi-level values with less margin, misreads and margin reduction of memory cells located in the outer periphery of the virtual-grounding memory cell array region can be prevented.

Further, according to one embodiment, since the dummy cell threshold setting means is implemented by a negative-voltage supply transistor capable of applying a negative voltage to columns of the dummy cells of the virtual-grounding dummy cell array region, the dummy cell threshold setting means can be constructed with a simple circuit, so that increase in the chip size can be suppressed to the utmost. In particular, when the negative-voltage supply transistor is connected to a negative voltage source for supplying a negative voltage to memory cells of the virtual-grounding memory cell array region, the need for providing additional power supply or the like for use of dummy cells is eliminated, so that the circuit is never complicated.

Further, in the nonvolatile semiconductor storage device in one embodiment, the virtual-grounding dummy cell array region has a device configuration, an interconnect layer configuration and interconnections similar to those of the virtual-grounding memory cell array region, thus simple to fabricate. Besides, collapses in arrangement pattern of the gate electrodes and the like in the peripheral portions of the virtual-grounding memory cell array region can be prevented, by which variations in the characteristics of memory cells can be suppressed.

Further, in the nonvolatile semiconductor storage device according to one embodiment, since the setting of the highest threshold on the memory cells of the virtual-grounding memory cell array region is done block by block or collectively, while the setting of the highest threshold to the dummy cells is performed simultaneously, the setting of the threshold to the dummy cells does not cause any additional increase in the setting time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor storage device comprising:

a virtual-grounding memory cell array region in which memory cells are arrayed in rows and columns, each of the memory cells comprising a floating-gate field-effect transistor having control gate, floating gate, drain and source and capable of electrically programming and erasing information, the virtual-grounding memory cell array region further containing a plurality of row lines to which the control gates of memory cells constituting individual rows are connected, respectively, as well as a plurality of column lines to which the drains of memory cells constituting individual columns and the sources of memory cells constituting individual columns other than said individual columns are connected, respectively; and a virtual-grounding dummy cell array region in which dummy cells are arrayed in rows and columns, each of the memory cells comprising a floating-gate field-effect transistor having control gate, floating gate, drain and source, the virtual-grounding dummy cell array region further containing the plurality of row lines to which the control gates of dummy cells constituting individual rows are connected, respectively, as well as a plurality of column lines to which the drains of memory cells constituting individual columns and the sources of memory cells constituting individual columns other than said individual columns are connected, respectively, the virtual-grounding dummy cell array region being placed in outer periphery of the virtual-grounding memory cell array region, wherein the nonvolatile semiconductor storage device has a function of injecting electrons into the floating gates of at least dummy cells located in a neighborhood of the virtual-grounding memory cell array region.

2. The nonvolatile semiconductor storage device according to claim 1, comprising dummy cell threshold setting means capable of injecting electrons into the floating gates of at least dummy cells neighboring the virtual-grounding memory cell array region out of the dummy cells in the virtual-grounding dummy cell array region, thereby setting threshold of the dummy cells to a high value.

3. The nonvolatile semiconductor storage device according to claim 2, wherein each of the memory cells is enabled to have three or more thresholds corresponding to three- or higher-valued storage states, and the dummy cell threshold setting means sets the threshold of the dummy cells to the highest threshold out of the three or more thresholds.

4. The nonvolatile semiconductor storage device according to claim 2, wherein the dummy cell threshold setting means is a negative-voltage supply transistor connected to the column lines of the dummy cells in the virtual-grounding dummy cell array region and capable of applying a negative voltage thereto.

5. The nonvolatile semiconductor storage device according to claim 3, wherein the dummy cell threshold setting means is a negative-voltage supply transistor connected to the column lines of the dummy cells in the virtual-grounding dummy cell array region and capable of applying a negative voltage thereto.

6. The nonvolatile semiconductor storage device according to claims 1, wherein the virtual-grounding dummy cell array region has a device configuration, an interconnect layer configuration and interconnections similar to those of the virtual-grounding memory cell array region.

7. The nonvolatile semiconductor storage device according to claim 1, wherein the setting of the highest threshold to the memory cells in the virtual-grounding memory cell array region is performed in blocks or collectively, and, at the same time, the setting of the highest threshold to the dummy cells is performed.

* * * * *